(12) United States Patent
Stubbs

(10) Patent No.: US 10,167,545 B2
(45) Date of Patent: Jan. 1, 2019

(54) INDIUM TIN OXIDE THIN FILMS WITH BOTH NEAR-INFRARED TRANSPARENCY AND EXCELLENT RESISTIVITY

(71) Applicant: Nanoco Technologies Ltd., Manchester (GB)

(72) Inventor: Stuart Stubbs, Manchester (GB)

(73) Assignee: Nanoco Technologies Ltd., Manchester (GB)

(*) Notice: Subject to any disclaimer, the term of this patent is extended or adjusted under 35 U.S.C. 154(b) by 0 days.

(21) Appl. No.: 15/492,185

(22) Filed: Apr. 20, 2017

(65) Prior Publication Data

US 2017/0306470 A1    Oct. 26, 2017

Related U.S. Application Data

(60) Provisional application No. 62/325,797, filed on Apr. 21, 2016.

(51) Int. Cl.
| | | |
|---|---|---|
| *C23C 14/08* | (2006.01) | |
| *H01L 33/42* | (2010.01) | |
| *H01L 31/0224* | (2006.01) | |
| *C23C 14/34* | (2006.01) | |
| *C03C 17/245* | (2006.01) | |
| *H01B 1/08* | (2006.01) | |
| *H01L 31/18* | (2006.01) | |

(52) U.S. Cl.
CPC ........ *C23C 14/086* (2013.01); *C03C 17/2453* (2013.01); *C23C 14/34* (2013.01); *H01B 1/08* (2013.01); *H01L 31/022475* (2013.01); *H01L 31/1884* (2013.01); *H01L 33/42* (2013.01); *C03C 2218/154* (2013.01)

(58) Field of Classification Search
CPC .................................................. C23C 14/086
USPC .......................................................... 428/220
See application file for complete search history.

(56) References Cited

U.S. PATENT DOCUMENTS

| | | | | |
|---|---|---|---|---|
| 2007/0036914 A1* | 2/2007 | Tsuji | ..................... | C23C 16/407 427/569 |
| 2012/0112187 A1* | 5/2012 | Orita | ................... | C23C 18/1216 257/43 |
| 2012/0213949 A1* | 8/2012 | Weng | .................. | C23C 14/0036 427/576 |

OTHER PUBLICATIONS

Kim, Eun-Hye, et al., (2011), "The Crystallinity and Mechanical Properties of Indium Tin Oxide Coatings on Polymer Substrates", Journal of Applied Physics 109, 043511.

(Continued)

*Primary Examiner* — Tahseen Khan
(74) *Attorney, Agent, or Firm* — Blank Rome, LLP

(57) ABSTRACT

An indium tin oxide film containing by weight about 90% $In_2O_3$ and about 10% $SnO_2$ is prepared using a low-energy deposition sputter process on a substrate. The indium tin oxide film thus obtained has a carrier concentration on the order of $10^{20}/cm^3$ and a carrier mobility greater than 30 $cm^2/Vs$. The low carrier concentration results in an increased transmission in the near infra-red region, while the high carrier mobility results in good conductive properties.

5 Claims, 4 Drawing Sheets

(56) References Cited

OTHER PUBLICATIONS

Triambulo, Ross E., et al., (2013), "Highly Flexible, Hybrid-Structured Indium Tin Oxides for Transparent Electrodes on Polymer Substrates", Appl. Phys. Lett. 102, 241913.
Yang, Chan-Woo, et al., (2010), "The Cohesive Crack and Buckle Delmination Resistances of Indium Tin Oxide (ITO) Films on Polymeric Substrates With Ductile Metal Interlayers", Surface & Coatings Technology 204, pp. 2761-2766.

\* cited by examiner

INDIUM TIN OXIDE THIN FILMS WITH BOTH NEAR-INFRARED TRANSPARENCY AND EXCELLENT RESISTIVITY

CROSS REFERENCE TO RELATED APPLICATIONS

This application claims the benefit of U.S. Provisional Application No. 62/325,797 filed Apr. 21, 2016, the contents of which are hereby incorporated by reference in its entirety.

BACKGROUND OF THE INVENTION

1. Field of the Invention

The present invention generally relates to transparent conductive oxides (TCO's). More particularly, it relates to indium tin oxide (ITO) thin films for display screen or photovoltaic applications.

2. Description of the Related Art

Indium tin oxide (ITO) is the most widely used transparent conductive oxide (TCO) with applications in display panel technology for liquid crystal displays (LCD's) and touch screen devices, photovoltaics, and other optoelectronic devices.

The purpose of such layers is to act as a conductive electrode while allowing light to pass for display or photovoltaic applications.

Indium tin oxide (ITO, or tin-doped indium oxide) is a mixture of indium(III) oxide ($In_2O_3$) and tin(IV) oxide ($SnO_2$), typically 90% $In_2O_3$, 10% $SnO_2$ by weight. It is transparent and colorless in thin layers. In bulk form, it is yellowish to grey. In the infrared region of the spectrum it acts as a metal-like mirror.

Indium tin oxide is one of the most widely used transparent conducting oxides because of its two main properties—its electrical conductivity and optical transparency, plus the ease with which it can be deposited as a thin film. As with all transparent conducting films, a compromise must be made between conductivity and transparency, inasmuch as increasing the thickness and increasing the concentration of charge carriers will increase the material's conductivity, but decrease its transparency.

Thin films of indium tin oxide are most commonly deposited on surfaces by physical vapor deposition. Often used is electron beam evaporation, or a range of sputter deposition techniques.

Indium tin oxide (ITO) is an optoelectronic material that is applied widely in both research and industry. ITO can be used for many applications, such as flat-panel displays, smart windows, polymer-based electronics, thin film photovoltaics, and architectural windows. Moreover, ITO thin films for glass substrates can be helpful for glass windows to conserve energy.

ITO green tapes are utilized for the production of lamps that are electroluminescent, functional, and fully flexible. Also, ITO thin films are used primarily to serve as coatings that are anti-reflective and for liquid crystal displays (LCDs) and electroluminescence, where the thin films are used as conducting, transparent electrodes.

ITO is often used to make transparent conductive coatings for displays such as liquid crystal displays, flat panel displays, plasma displays, touch panels, and electronic ink applications. Thin films of ITO are also used in organic light-emitting diodes, solar cells, antistatic coatings and EMI shieldings. In organic light-emitting diodes, ITO is used as the anode (hole injection layer).

ITO is also used for various optical coatings, most notably infrared-reflecting coatings (hot mirrors) for automotive, and sodium vapor lamp glasses. Other uses include gas sensors, antireflection coatings, electrowetting on dielectrics, and Bragg reflectors for vertical-cavity surface-emitting lasers (VCSEL). ITO is also used as the IR reflector for low-e window panes.

ITO is a heavily-doped n-type semiconductor with a large bandgap of around 4 eV. Because of the bandgap, it is mostly transparent in the visible part of the spectrum and its extinction coefficient, k, in this wavelength range is zero. In the ultraviolet (UV), it is opaque, so that k is non zero in the UV spectral range, because of band-to-band absorption (a UV photon can excite an electron from the valence band to the conduction band). It is also opaque in the near infrared (NIR) and infrared (IR), because of free carrier absorption (an infrared photon can excite an electron from near the bottom of the conduction band to higher within the conduction band). In this wavelength range k is non-zero, and reaches its maximum value in the IR regime, similar to the behavior of k for metals.

ITO has attractive properties including high level of transmittance in the visible region as well as electrical conductivity that is unique. This is mainly due to ITO's highly degenerate behavior as an n-type semiconductor with a large band gap of around 3.5 to 4.3 eV.

ITO has been popularly used as a high-quality flexible substrate to produce flexible electronics. However, this substrate's flexibility decreases as its conductivity improves. Previous research has indicated that the mechanical properties of ITO can be improved through increasing the degree of crystallinity [E. H. Kim, C. W. Yang, and J. W. Park, *J. Appl. Phys.* 109, 043511 (2011)].

Doping with silver (Ag) can improve this property, but results in a loss of transparency [C. W. Yang and J. W. Park, *Surf Coat. Technol.* 204 (16-17), 2761 (2010)].

An improved method that embeds Ag nanoparticles (Ag NPs) to create a hybrid ITO has proven to be effective in compensating for the decrease in transparency. The hybrid ITO consists of domains in one orientation grown on the Ag NPs and a matrix of the other orientation. The domains are stronger than the matrix and function as barriers to crack propagation, significantly increasing the flexibility. The change in resistivity with increased bending significantly decreases in the hybrid ITO compared with homogenous ITO (Triambulo, R. E.; Kim, J.; Na, M.; Chang, H.; Park, J. Highly Flexible, Hybrid-Structured Indium Tin Oxides for Transparent Electrodes on Polymer Substrates, *Applied Physics Letters* [Online] 2013, 102, 24, p241913).

Alternative TCO materials have been used with success such as zinc-doped aluminum oxide (AZO). Despite this fact, ITO remains the most widely used TCO in consumer electronics with widespread use particularly in display applications but also in photovoltaic and optoelectronic devices in general.

Indium is a material known to have a finite supply but this has not limited its use to date. One benefit of ITO over other TCO materials such as AZO is that it is more resistant to oxygen and moisture damage.

Electrical resistivity (also known as "resistivity," "specific electrical resistance," or "volume resistivity") is an intrinsic property that quantifies how strongly a given material opposes the flow of electric current. A low resistivity indicates a material that readily allows the flow of electric current. Resistivity is commonly represented by the Greek letter ρ (rho). The SI unit of electrical resistivity is the ohm·meter (Ω·m) although other units like ohm·centimeter (Ω·cm) are also in use. As an example, if a 1 m×1 m×1 m solid cube of material has sheet contacts on two opposite faces, and the resistance between these contacts is 1Ω, then the resistivity of the material is 1 Ω·m.

Electrical conductivity or specific conductance is the reciprocal of electrical resistivity, and measures a material's ability to conduct an electric current. It is commonly represented by the Greek letter σ (sigma), but κ (kappa) (especially in electrical engineering) or γ (gamma) are also occasionally used. Its SI unit is siemens per meter (S/m) and the CGSE unit is reciprocal second ($s^{-1}$).

BRIEF SUMMARY OF THE INVENTION

The present invention provides an indium tin oxide film having a low carrier concentration and a high carrier mobility. Per literature and experience, typical ITO films have a higher carrier concentration on the order of $10^{21}/cm^3$ and a lower mobility of approximately 15 $cm^2/Vs$. The indium tin oxide film of the current invention has a carrier concentration that is about an order of magnitude lower which results in an increased transmission in the near infra-red (NIR). The indium tin oxide film of the current invention also has a carrier mobility that is much higher than typical which results in good conductive properties.

The present invention also provides a low-energy sputter deposition process that produces an indium tin oxide film having a low carrier concentration and a high carrier mobility. The former leads to an increased transmission in the near infra-red (NIR), while the latter results in good conductive properties.

DETAILED DESCRIPTION OF THE INVENTION

Figure 1:
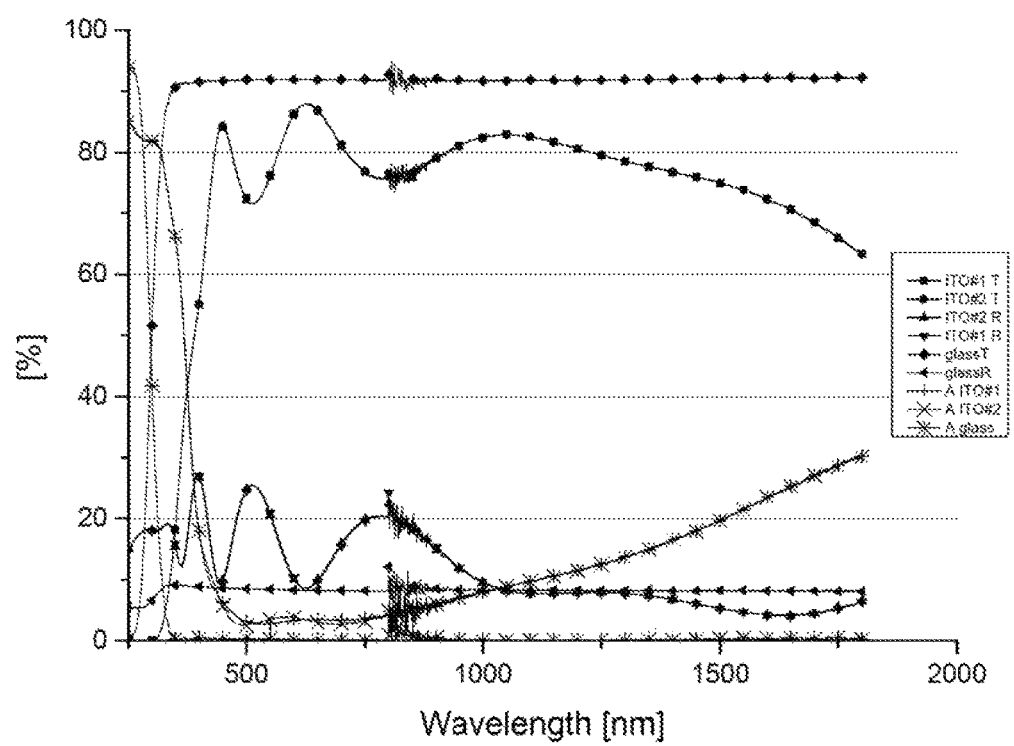
FIG. 1 is a graph of transmission (T), reflection (R) and absorption (A) for Sample ITO#1, Sample ITO#2 and glass (as a reference).

In this invention, an indium tin oxide film is prepared. The indium tin oxide film contains about 90% $In_2O_3$ by weight and about 10% $SnO_2$ by weight, and is about 350 nm in thickness. The indium tin oxide film has a bulk concentration on the order of $10^{20}/cm^3$ and a carrier mobility greater than 15 $cm^2/Vs$.

In a preferred embodiment, the indium tin oxide film is 99.99% pure, and contains by weight 90% $In_2O_3$ and 10% $SnO_2$.

In another preferred embodiment, the indium tin oxide film is 350 nm in thickness.

In another preferred embodiment, the bulk concentration of the indium tin oxide film is $-3.68 \times 10^{20}/cm^3$; the carrier mobility is 36.9 cm/Vs; the resistivity is $4.59 \times 10^{-4}$ Ω·cm; and the transmission in the 700 nm to 1500 nm portion of the near infra-red region is greater than 75%. The negative sign for the carrier bulk concentration indicates that the carrier material is an n-type material whereby electrons are the majority charge carrier.

In another preferred embodiment, the bulk concentration of the indium tin oxide film is $-3.06 \times 10^{20}/cm^3$; the carrier mobility is 42.3 cm/Vs; the resistivity is $4.82 \times 10^{-4}$ Ω·cm; and the transmission in the 700 nm to 1500 nm portion of the near infra-red region is greater than 75%.

In this invention, a particular sputter process is used for the deposition of the ITO film having the enhanced properties—most notably, high near-IR transparency and low resistivity.

The various aspects of the sputter process are explained as follows:

1. An indium tin oxide sputter target is chosen that contains $In_2O_3$ and $SnO_2$ in a 90:10 ratio by weight. The 90:10 ratio by weight represents a low percentage of $SnO_2$ in deposition. The indium tin oxide film formed contains the $In_2O_3$ and $SnO_2$ in 99.99% by total weight.

2. Argon alone is used as the sputter gas.

3. An example of the partial pressure of argon in the sputter chamber is 3.5 mTorr. The 3.5 mTorr pressure is somewhat higher than that commonly used for ITO depositions where <1 mTorr is typical.

4. An example of the radio frequency (RF) power used in the deposition is 47 W on a 75 mm diameter target. This RF power level correlates to a power density of 1.06 $W/cm^2$, lower than the >4 $W/cm^2$ typically used to create ITO films at high deposition rates.

5. The sputter deposition of the indium tin oxide target on a substrate is continued for a time sufficient to produce a film of a chosen thickness. The thickness is chosen based on the desired values of NIR transmission and resistivity. An example of the film thickness is 350 nm.

The optimum combination of power and pressure is determined by mapping out a response curve with respect to the characteristic properties, for example, resistivity and transmission, using Design of Experiment (DoE) techniques.

A high carrier concentration and a correspondingly high absorption in the NIR is a common problem faced in ITO. In its application as a TCO in photovoltaics, surmounting these problems can lead to an increase in short-circuit current and a high fill factor.

As discussed above, as with all transparent conducting films, a compromise must be made between conductivity and transparency. Although increasing the thickness and the concentration of charge carriers increases the material's conductivity, it decreases transparency. A thickness of about 350 nm represents a balance between conductivity and transparency. Thicker films may be expected to provide a higher conductivity counter-balanced by a lower transmission, as is well known in the field.

The thickness during the deposition may be monitored using well-established methods. For example, using a quartz crystal monitor and further calibrated using a Dektak® profilometer [Bruker Nano, Inc., 3400 E. Britannia Drive, Suite 150, Tucson, Ariz. 85706] to confirm that the correct thickness is reached.

Using conventional processing methods, the ITO films have a high carrier concentration on the order of $10^{21}/cm^3$ and a low mobility of approximately 15 $cm^2/Vs$. The ITO films produced according to the current invention have a carrier concentration an order of magnitude lower and a higher mobility.

Examples

Using the following parameters, film samples ITO #1 and ITO #2 were prepared.
1. Glass, such as a soda lime glass plate, was used as a substrate.
2. An indium tin oxide sputter target contained $In_2O_3$ and $SnO_2$ in a 90:10 ratio by weight.
3. Argon as the sputter gas was set at 3.5 mTorr in the sputter chamber.
4. Radio frequency (RF) power at 47 W was used on a 75 mm diameter circular target. This RF power level correlates with a power density of 1.06 W/cm$^2$.
3. The sputter deposition was continued until the film thickness reached 350 nm.

The properties of ITO #1 and ITO #2 are presented in Table 1. The variations between samples "ITO#1" and "ITO#2" are attributed to process-to-process variability.

TABLE 1

Hall measurement and sheet resistance

|  | ITO#1 | ITO#2 |
|---|---|---|
| Bulk concentration [cm$^{-3}$] | $-3.68 \times 10^{20}$ | $-3.06 \times 10^{20}$ |
| Mobility [cm/Vs] | 36.9 | 42.3 |
| Resistivity [Ωcm] | $4.59 \times 10^{-4}$ | $4.82 \times 10^{-4}$ |
| Sheet resistance [Ω/■] | 15.7 | 16.0 |

The Hall Effect measurements were used to ascertain the carrier concentration, mobility and resistivity.

A four point probe was used for the sheet resistance measurement.

A Dektak® profilometer was used for thickness measurement.

Figure 1A:
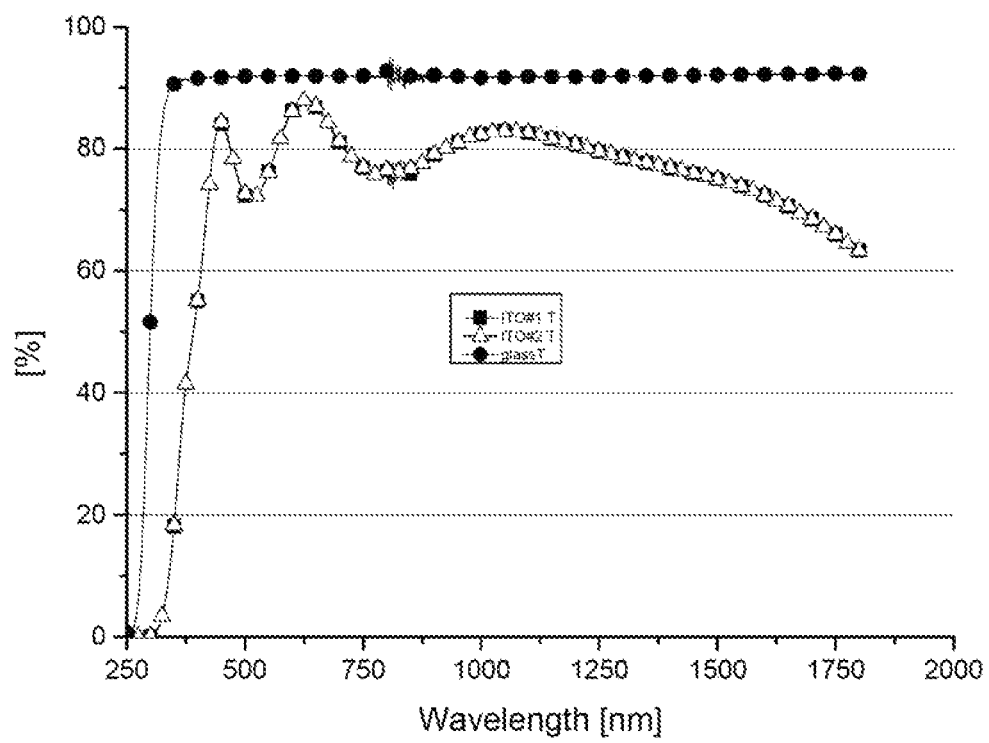
FIG. 1A is a breakout graph of FIG. 1 showing transmission (T) for Sample ITO#1, Sample ITO#2 and glass (as a reference).
Figure 1B:
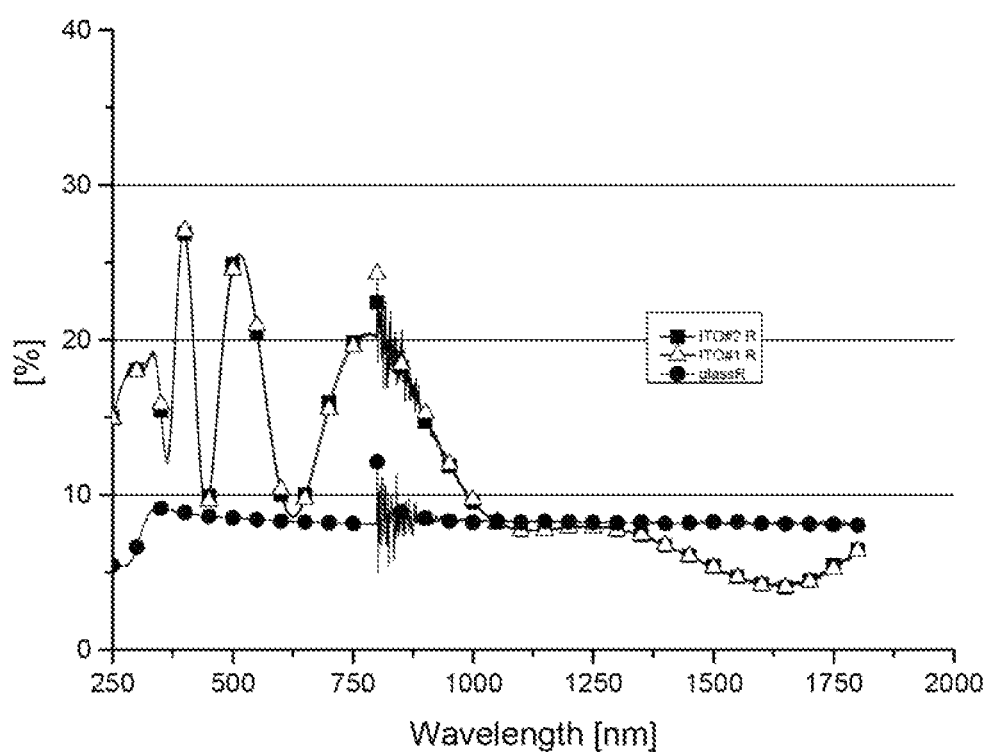
FIG. 1B is a breakout graph of FIG. 1 showing reflection (R) for Sample ITO#1, Sample ITO#2 and glass (as a reference).
Figure 1C:
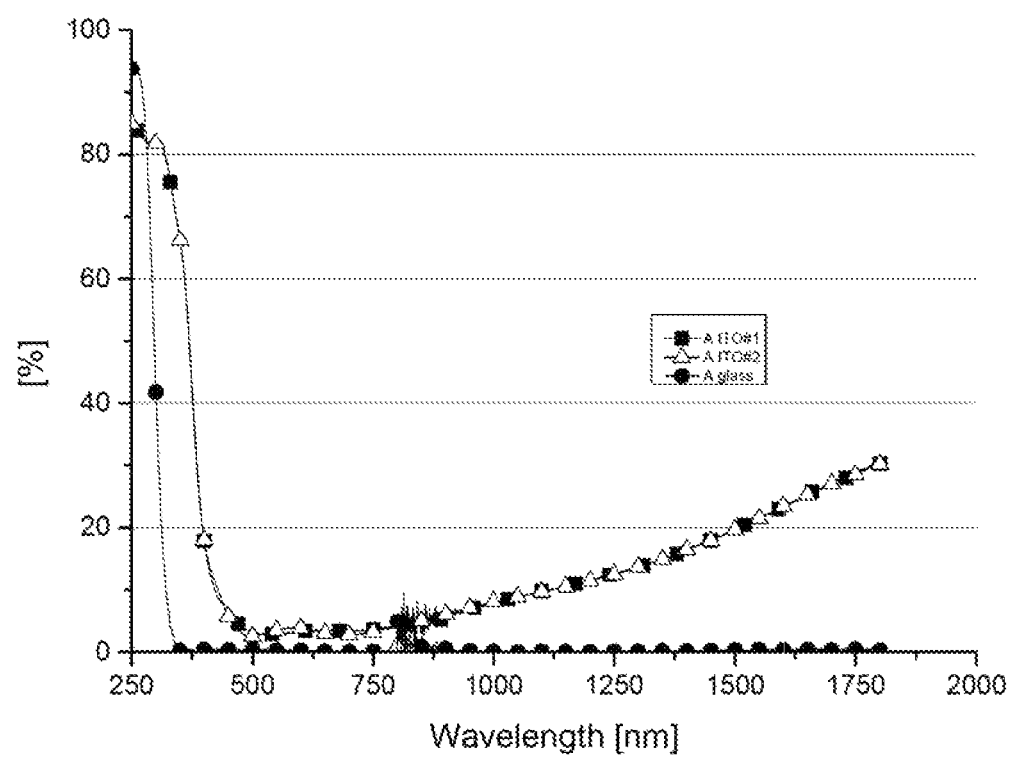
FIG. 1C is a breakout graph of FIG. 1 showing absorption (A) for Sample ITO#1, Sample ITO#2 and glass (as a reference).

A spectrophotometer was used for transmission and reflectance measurements, with additional calculation of the band gap. The transmission (T), reflection (R) and absorption (A) for Sample ITO#1, Sample ITO#2 and glass (as a reference) are plotted in FIGS. 1 and 1A-1C. As shown in FIG. 1A, the transmission from 700-1500 nm is 75-83%.

The foregoing presents particular embodiments of a system embodying the principles of the invention. Those skilled in the art will be able to devise alternatives and variations which, even if not explicitly disclosed herein, embody those principles and are thus within the scope of the invention. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A method for a sputter deposition of an indium tin oxide film comprising:
   providing an indium tin oxide target comprising $In_2O_3$ and $SnO_2$ in a ratio of about 90:10 by weight;
   providing argon alone as a sputter gas at a pressure of about 3.5 millitorr; and
   sputtering the indium tin oxide target on a substrate at a radio frequency power density of about 1.0 W/cm$^2$ to obtain an indium tin oxide film having a transmission greater than 75% from 700 nm to 1500 nm.

2. The method of claim 1 wherein the sputtering is continued for a time sufficient to produce the indium tin oxide film having a thickness of about 350 nm.

3. The method of claim 1 wherein the sputter gas is at a pressure of 3.5 millitorr.

4. An indium tin oxide film comprising by weight about 90% $In_2O_3$ and about 10% $SnO_2$, wherein the indium tin oxide film is about 350 nm in thickness, further wherein the indium tin oxide film is prepared by a method for a sputter deposition comprising the steps of:
   providing an indium tin oxide target comprising $In_2O_3$ and $SnO_2$ in a ratio of about 90:10 by weight;
   providing argon alone as a sputter gas at a pressure of about 3.5 millitorr; and
   sputtering the indium tin oxide target on a substrate at a radio frequency power density of about 1.0 W/cm$^2$ to obtain the indium tin oxide film
   wherein the indium tin oxide film provides a transmission greater than 75% from 700 nm to 1500 nm.

5. The indium tin oxide film of claim 4, wherein the $In_2O_3$ and $SnO_2$ are 90% and 10% by weight respectively, further wherein the indium tin oxide film provides a carrier concentration on the order of $10^{20}$/cm$^3$.

* * * * *